United States Patent

Moll

Patent Number: 6,127,871
Date of Patent: Oct. 3, 2000

[54] VARIABLE DIGITAL DELAY LINE

[75] Inventor: Joachim Moll, Herrenberg, Germany

[73] Assignee: Hewlett-Packard Company, Fort Collins, Colo.

[21] Appl. No.: 09/177,007

[22] Filed: Oct. 22, 1998

[30] Foreign Application Priority Data

Nov. 18, 1997 [EP] European Pat. Off. ............. 97120157

[51] Int. Cl.[7] .................................................... H03H 11/26
[52] U.S. Cl. ......................... 327/270; 327/261; 327/271; 331/57
[58] Field of Search ................................. 327/261, 270, 327/271; 331/57

[56] References Cited

U.S. PATENT DOCUMENTS

| 4,797,586 | 1/1989 | Traa . | |
|---|---|---|---|
| 5,521,539 | 5/1996 | Molin | ....................... 327/274 |
| 5,686,851 | 11/1997 | Yamada | ................................... 327/270 |

FOREIGN PATENT DOCUMENTS

| 0562904A1 | 3/1993 | European Pat. Off. . |
| 0676864A1 | 4/1995 | European Pat. Off. . |

*Primary Examiner*—Margaret R. Wambach
*Assistant Examiner*—Cassandra Cox

[57] ABSTRACT

Described is a variable digital delay cell with a first input for receiving a first input signal to be delayed, a first output for providing a first output signal which is delayed with respect to the first input signal, and a control signal for controlling the delay time of the delay cell. The delay cell further includes a second input for receiving a second input signal which is delayed with respect to the first input signal, and a second output for providing a second output signal which is delayed with respect to the first input signal by a fixed delay time. The delay cell according to the invention can be driven as a single device, but also allows a cascading of an 'unlimited' number of delay cells without increasing the base delay in comparison to a single delay cell.

12 Claims, 8 Drawing Sheets

VARIABLE DIGITAL DELAY LINE

BACKGROUND OF THE INVENTION

The present invention generally relates to variable digital delay lines and cascades thereof.

Delay lines—or delay cells as a synonym—are often applied in order to delay an output signal by a certain delay time with respect to an input signal. There are delay lines with a fixed delay time, and variable delay lines which allow different delay times in a predetermined range.

FIG. 1a shows a structural representation of a variable digital delay cell 5 receiving an input signal INPUT and providing an output signal OUTPUT delayed with respect to the input signal INPUT by a variable delay time $t_{del}$. The value of the delay time $t_{del}$ can be set by means of a control signal CTRL.

FIG. 1b depicts a structural representation of an embodiment of the variable digital delay cell 5. The input signal INPUT is applied to a first signal processing unit 10 and to a delay stage 20 with a fixed delay time $T_D$. The delay stage 20 can be any delay circuit as known in the art such as a passive circuit, e.g. an R-C combination, or an active circuit like a buffer amplifier. An output signal of the delay stage 20 is connected to a second signal processing unit 30. Output signals of the first 10 and second 30 signal processing units are applied to a third signal processing unit 40 which combines those signals and processes therefrom the output signal OUTPUT, which is delayed with respect to the input signal INPUT by a variable delay time $t_{del}$. Either the first 10 and second 30 signal processing units or the third signal processing unit 40, or all of the signal processing units, receive control signals from a control unit 50 in order to set the variable delay time $t_{del}$ of the variable delay cell 5 in accordance with the applied control signal CTRL.

FIG. 1c shows as an example for the variable digital delay cell 5 embodied in ECL (emitter-coupled logic), which receives and processes differential signals. However, it is clear that the variable digital delay cell 5 can also be implemented by means of other logical elements or in a different logic such as a single line logic. The first 10 and second 30 signal processing units and the control unit 50 are embodied as current switches, and the third signal processing unit 40 is embodied as a sum up stage.

The input signal INPUT ($V_A$) is connected to current switch 10 and to the delay stage 20 with a fixed delay time $T_D$. An output signal $V_B$ of the delay stage 20 is connected to current switch 30. Output signals of the current switch 10 (complementary currents $I_{AC}$ and $I_{AN}$) and of the current switch 30 (complementary currents $I_{BC}$ and $I_{BN}$) are added by means of sum up stage 40, and the sum thereof represents the output signal OUTPUT of the variable delay cell 5.

A current $I_{Ref}$ is split by the control unit 50 into a current $I_A$ applied to the current switch 10 and a current $I_B$ applied to the current switch 30. By changing the ratio of the currents $I_A$ to $I_B$, the delay time $t_{del}$ of the output signal OUTPUT with respect to the input signal INPUT can be varied. A minimum value $t_{delmin}$ of the delay time $t_{del}$ is achieved when $I_A=I_{Ref}$ and $I_B=0$, whereby $t_{delmin}$ will be the base delay of the variable delay cell 5 determined by the propagation delay through the current switch 10 and the sum up stage 40. A medium value $t_{delmed}$ can be set when $I_A=I_{Ref}/2=I_B$, and a maximum value $t_{delmax}$ can be gained when $I_A=0$ and $I_B=I_{Ref}$. The maximum value $t_{delmax}$ substantially equals the fixed delay time $T_D$ of the delay stage 20 plus a propagation delay through the current switch 30 and the sum up stage 40. The ratio $I_A$ to $I_B$ can be controlled by the control signal CTRL embodied as an analog voltage.

FIG. 1d depicts signal diagrams within the circuit of FIG. 1c for an exemplary ratio $I_A$ to $I_B$. It is to be understood that the crossing points of the differential signals, or accordingly, the medium value of the signal differences or the crossing points of the complementary currents, shall represent time marks to compare the timing of the signals. The voltage $V_B$ is delayed with respect to the voltage $V_A$ by the fixed delay time $T_D$ of the delay stage 20. The output signal OUTPUT received from the current sums $(I_{AC}+I_{BC})$ and $(I_{AN}+I_{BN})$ is delayed with respect to the input signal INPUT by the effective delay time $t_{del}$.

In the circuits of FIGS. 1b and 1c, the maximum applicable delay time $T_D$ of the delay stage 20 is limited to the transition time $t_T$ (compare FIG. 1d) of output signals of the current switches 10 and 30 so that $T_D$ is selected to be $T_D<t_T$. However on the other hand, the delay time $t_{del}$ is limited to the delay time $T_D$, so that the delay time $t_{del}$ of the circuit of FIG. 1a is limited to $t_{del} \leq T_D < t_T$. A delay time $t_{del}$ selected to be greater than the transition time $t_T$ would cause 'horizontal steps' in the output signal OUTPUT during a transition, which lead to jitter and generally are to be avoided.

In modern bipolar circuits such as ECL circuits, the base delay (as the minimum delay time $t_{delmin}$) of such a delay cell 5 typically is in the range of about 50 to 100 ps, and the transition times of digital output signals typically is in the range of 100 to 200 ps. That means that the typical delay range of the delay cell 5 will be between a minimum of 50 to 100 ps and maximum of 100 to 200 ps, which leads to an applicable ratio ($t_{delmin}/t_{delmax}$) of about 1:2.

In order to provide greater values of the maximum delay time $t_{delmax}$, a plurality of delay cells may be arranged in consecutive cascades. FIG. 1e shows an example of two delay cells 5, according to FIG. 1a, arranged as a cascade in a serial manner. An output signal OUT_1 of a first delay cell 5.1 serves as an input signal IN_2 of a second delay cell 5.2. Further delay cells may be arranged accordingly. However, by connecting n delay cells 5 in series, the maximum delay time $t_{delmax}$ may be increased n times, but the base delay, and therefore the minimum delay time $t_{delmin}$, is also increased n times. That means not only that the cascade will always provide at minimum a delay time of $(n \times t_{delmin})$, but also that the ratio ($t_{delmin}/t_{delmax}$) still is 1:2.

There are several cascaded delay cells known in the art such as U.S. Pat. No. 5,210,450 disclosing a digital multiplexer-controlled delay generator that uses groups of current-switching elements to vary propagation delay in a connection input voltage to load. U.S. Pat. No. 4,797,586 discloses a high frequency signal controller delay circuit that adjusts the gain of each amplifier according to a control signal, so that at least one and not more than two amplifiers have a non-zero gain.

SUMMARY OF THE INVENTION

It is an object of the invention to provide a delay cell which allows a cascading of a plurality of those delay cells.

A variable digital delay cell according to the invention comprises a first input for receiving a first input signal to be delayed, a first output for providing a first output signal which is delayed with respect to the first input signal by a delay time of the delay cell, and a control signal for controlling the delay time of the delay cell. The delay cell further comprises a second input for receiving a second input signal which is delayed with respect to the first input signal, and a second output for providing a second output signal which is delayed with respect to the first input signal by a fixed delay time.

The delay cell according to the invention can be driven as a single device, but also allows a cascading of an 'unlimited' number of delay cells without increasing the base delay in comparison to a single delay cell. The number of delay cells in a cascade only is limited by 'external' factors such as the number of available gates, power dissipation, etc.

In a preferred embodiment of the delay cell, a first signal processing unit is coupled with an input thereof to the first input for receiving and processing the first input signal, and a delay stage provides the fixed delay time, whereby an input of the delay stage is coupled to the first input for receiving and delaying the first input signal by the fixed delay time, and an output of the delay stage is coupled to the second output for providing the first input signal delayed by the fixed delay time as the second output signal. A second signal processing unit is coupled with an input thereof to the second input for receiving and processing the second input signal. A third signal processing unit receives output signals from the first and second signal processing units, for processing therefrom the first output signal for the first output. A control unit is coupled to the first and second signal processing units and/or the third signal processing unit, for controlling the delay time of the delay cell in accordance with the applied control signal.

The advantages of the inventive delay cell become particularly apparent in a cascade of a plurality of individual delay cells grouped in a serial (or sequential) manner according to defined scheme. A first delay cell of the cascade receives a cascade input signal at the first input thereof and provides a cascade output signal at the first output thereof. The second output of a last delay cell in the cascade is coupled to the second input thereof. The first input of each delay cell in the cascade, except of the first delay cell, is coupled to the second output of its preceding delay cell. The first output of each delay cell, except of the first delay cell, is coupled to the second input of its preceding delay cell.

The base delay—as the minimum delay time—of the cascade is independent of the number of delay cells in the cascade and only determined by the base delay of the first delay cell in the cascade. However, the maximum delay time of the cascade depends on the number of delay cells in the cascade and is determined as the sum of the individual delay times in the cascade. Any value for the delay time between the base delay of the first delay cell and the sum of the individual delay times in the cascade can be selected. That means that the ratio ($t_{delmin}/t_{delmax}$) of the minimum delay time to the maximum delay time depends on the number of delay cells and their respective delay times. In case that the maximum delay times of all delay cells in a cascade of n delay cells substantially equal, the ratio ($t_{delmin}/t_{delmax}$) of the cascade is the base delay divided by n times the maximum delay time.

In a preferred embodiment, the control signal (for each individual delay cell) comprises a first control signal for setting the delay cell into a fixed or a variable mode, a second control signal for setting the delay time of the delay cell to a minimum delay time or to a maximum delay time, and a third control signal for setting the delay time of the delay cell to a value between the minimum and the maximum delay time. In the fixed mode, the delay time can be set by means of the second control signal to the minimum delay time or the maximum delay time. In the variable mode, the delay time can be set by means of the third signal to a value between the minimum and the maximum delay time of the delay cell.

The splitting of the control signal into a plurality of control signal allows a fine controlling of the individual delay cells, and in particular, that the control signals can be divided into digital and analog signals, whereby only the third control signal might be embodied as an analog signal. This leads to a significant simplification of the circuits for providing the control signals.

Only one third control signal must be provided in case that only one specific delay cell in the cascade will provide an intermediate value between the minimum and the maximum delay time. The delay time of that specific delay cell is set by means of its respective first control signal into the variable mode and regulated by means of the third control signal. Each other delay cell is set by means of its respective first control signal into the fixed mode, whereby the delay cell successive to the specific delay cell is set by means of its respective second control signal to a minimum delay time, and each delay cell preceding to the specific delay cell is set by means of its respective second control signal to a maximum delay time.

A specific application of the delay cells according to the invention, either as a single device or cascaded, is in an oscillator circuit, wherein the first output signal of the delay line or the cascade is coupled back via an inverter circuit to the first input signal of the delay line or the cascade. The oscillator circuit provides an oscillator frequency $f\sim1/t_{del}$. The improved ratio ($t_{delmin}/t_{delmax}$) of the cascade of delay cells according to the invention thus allows a wide applicable frequency range of the oscillator.

BRIEF DESCRIPTION OF THE DRAWINGS

Other objects and many of the attendant advantages of the present invention will be readily appreciated and become better understood by reference to the following detailed description when considering in connection with the accompanied drawings, in which:

FIG. 3d shows an arrangement of a plurality of delay cells of FIG. 3a.

DETAILED DESCRIPTION OF THE INVENTION

Figure 2A:
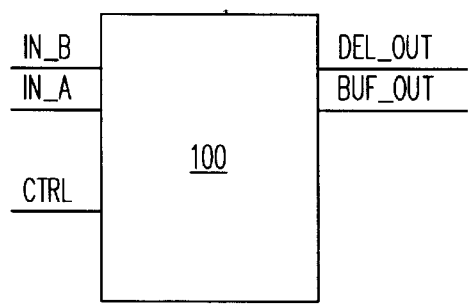
FIG. 2a–b show structural representations of variable delay cells 100 according to the invention.

FIG. 2a shows a structural representation of a variable delay cell 100 according to the invention. The delay cell 100 has as inputs a first input IN_A for receiving an input signal INPUT to be delayed, and a second input IN_B for receiving a delayed signal, e.g., from a successive delay cell. The delay cell 100 has as outputs a first output DEL_OUT for providing an output signal OUTPUT as the delayed input signal INPUT, and a second output BUF_OUT for providing the signal applied at the first input IN_A, however delayed by the maximum delay time $t_{delmax}$ of the delay cell 100, e.g., to a consecutive delay cell. The delay time $t_{del}$ of the delay cell 100 is controlled by a control signal CTRL.

Figure 1A:
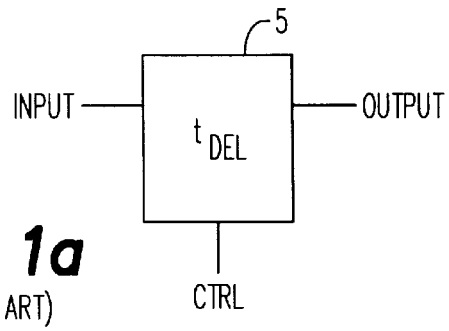
FIGS. 1a–c show structural representations of embodiments of variable digital delay cells as known in the art.

The delay cell 100—as a single delay cell—basically works according to the delay cell 5 as in FIG. 1a, whereby the additional second input IN_B and the second output BUF_OUT are coupled together. The input signal INPUT applied at the first input IN_A is delayed by a predefined delay time $t_{del}$ controlled by the control signal CTRL, and output at the first output DEL_OUT as the output signal OUTPUT.

Figure 1B:
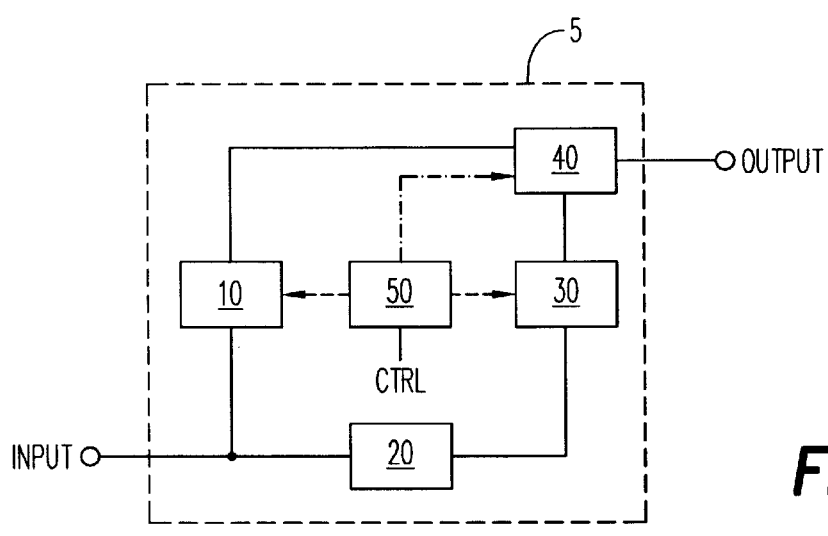
Figure 1C:
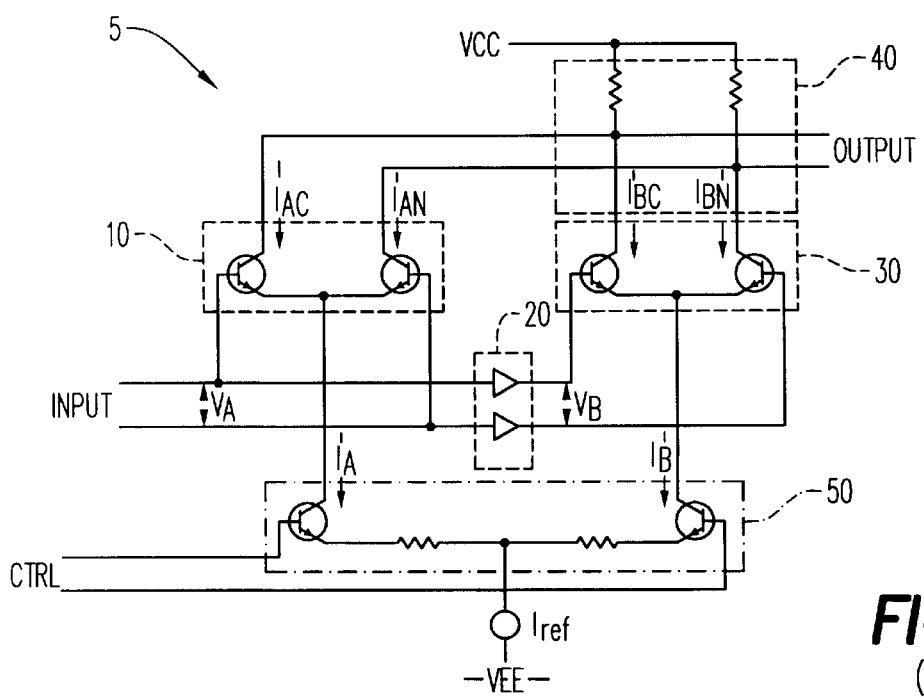
Figure 1D:
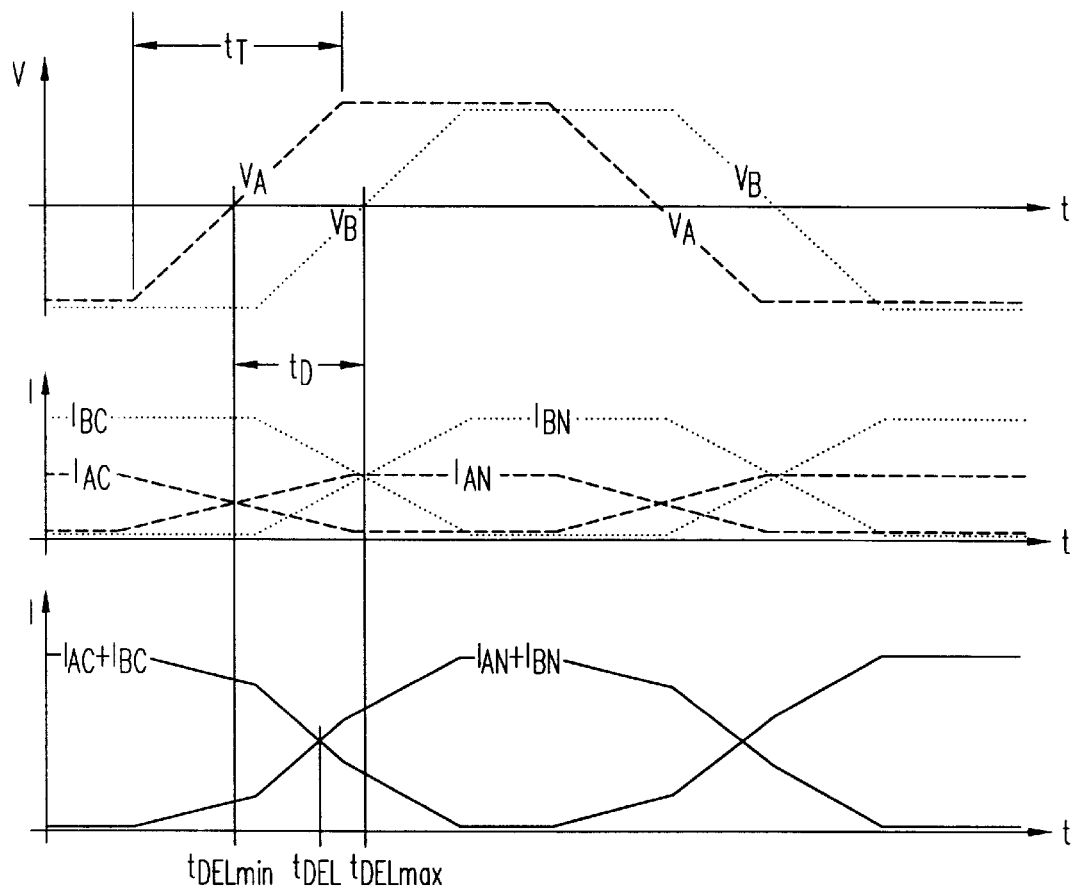
FIG. 1d depicts signal diagrams within the circuit of FIG. 1c for an exemplary ratio $I_A$ to $_B$.
Figure 1E:
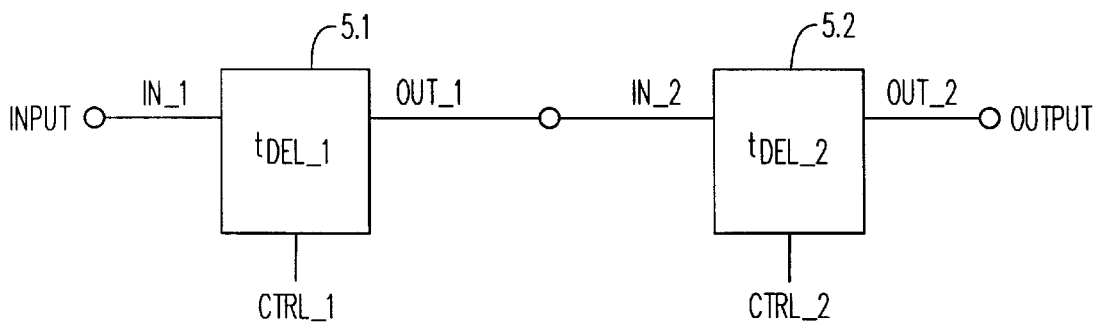
FIG. 1e shows an example of a cascade of two delay cells as known in the art.
Figure 2B:
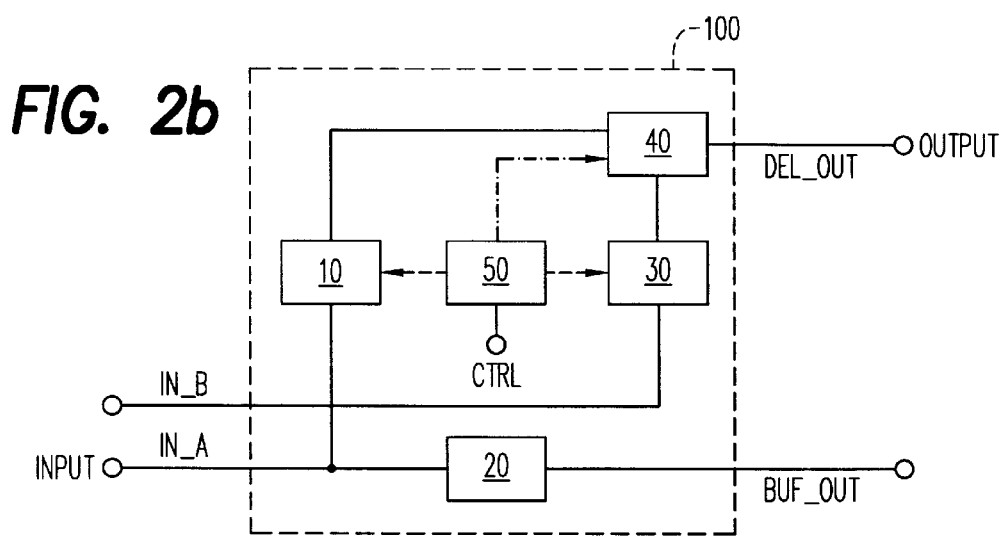

FIG. 2b depicts a structural representation of an embodiment of the variable digital delay cell 100 according to the invention, whereby the same elements as in FIG. 1b are used. The input signal INPUT is applied at the first input IN_A to the first signal processing unit 10 and to the delay stage 20 with a fixed delay time $T_D$. The variable digital delay cell 100 according to the invention distinguishes from the variable digital delay cell 5 in that an output signal of the delay stage 20 is provided as the second output BUF_OUT, and that the second input IN_B is provided as an input to the second signal processing unit 30. In accordance with the variable digital delay cell 5 of FIG. 1b, output signals of the first 10 and second 30 signal processing units are applied to the third signal processing unit 40 which combines the applied output signals and processes therefrom the output signal OUTPUT at the first output DEL_OUT, which is delayed with respect to the input signal INPUT by a variable delay time $t_{del}$. Either the first 10 and second 30 signal processing units or the third signal processing unit 40, or all of the signal processing units, receive control signals from the control unit 50 in order to set the variable delay time $t_{del}$ of the variable delay cell 100 in accordance with the applied control signal CTRL.

By comparing the delay cells 5 and 100 in FIGS. 1b and 2b, it becomes apparent that the delay cell 5 can be received from the delay cell 100 by directly connecting the second input IN_B with the second output BUF_OUT.

Figure 2C:
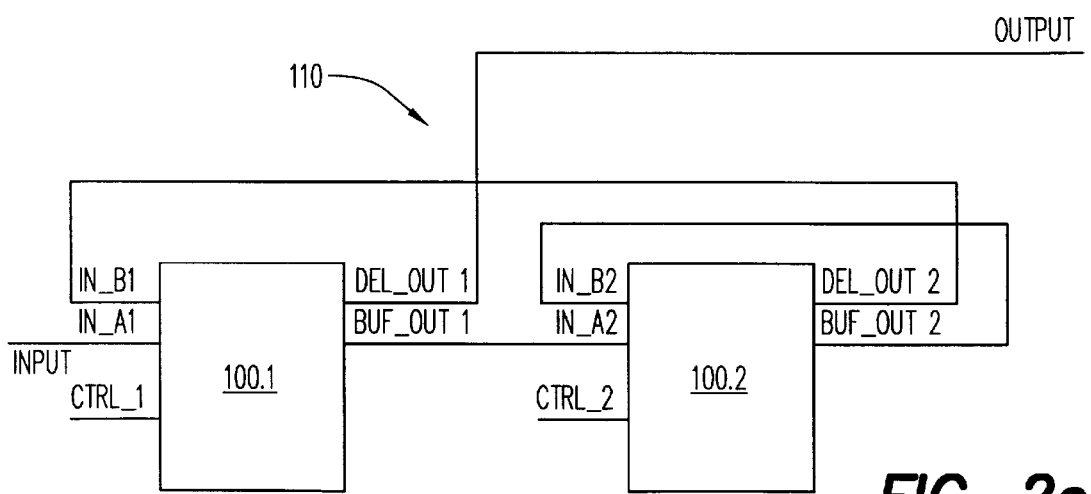
FIG. 2c shows a cascade of two delay cells according to FIG. 2b.

FIG. 2c shows two delay cells 100, according to FIG. 2b, sequentially arranged as a cascade 110 of delay cells. The input signal INPUT is applied at a first input IN_A1 of a first delay cell 100.1, delayed by a delay time $t_{del\_110}$ of the cascade 110, and output at a first output DEL_OUT_1 of the first delay cell 100.1 as the output signal OUTPUT of the cascade 110.

At a second output BUF_OUT_1, the first delay cell 100.1 provides a signal for a first input IN_A2 of a second delay cell 100.2 arranged successive to the first delay cell 100.1. The signal at BUF_OUT_1 represents the input signal INPUT applied at the first input IN_A1, however delayed by a fixed delay time $t_{delfix\_1}$, which approximately equals the maximum delay time $t_{delmax\_1}$ of the first delay cell 100.1. The signal at the first input IN_A2 is delayed by a delay time $t_{del\_2}$ as set by a control signal CTRL_2 of the second delay cell 100.2, output at an output DEL_OUT_2, and coupled back to a second input IN_B1 of the first delay cell 100.1. The signal at the second input IN_B1 is delayed by a delay time $t_{del\_1}$ as set by a control signal CTRL_1 of the first delay cell 100.1, and output as the output signal OUTPUT at the first output DEL_OUT_1 of the first delay cell 100.1. The second input IN_B2 receives the signal from the second output BUF_OUT_2 as a signal delayed by a maximum delay time $t_{delmax\_2}$ of the second delay cell 100.2.

Figure 2D:
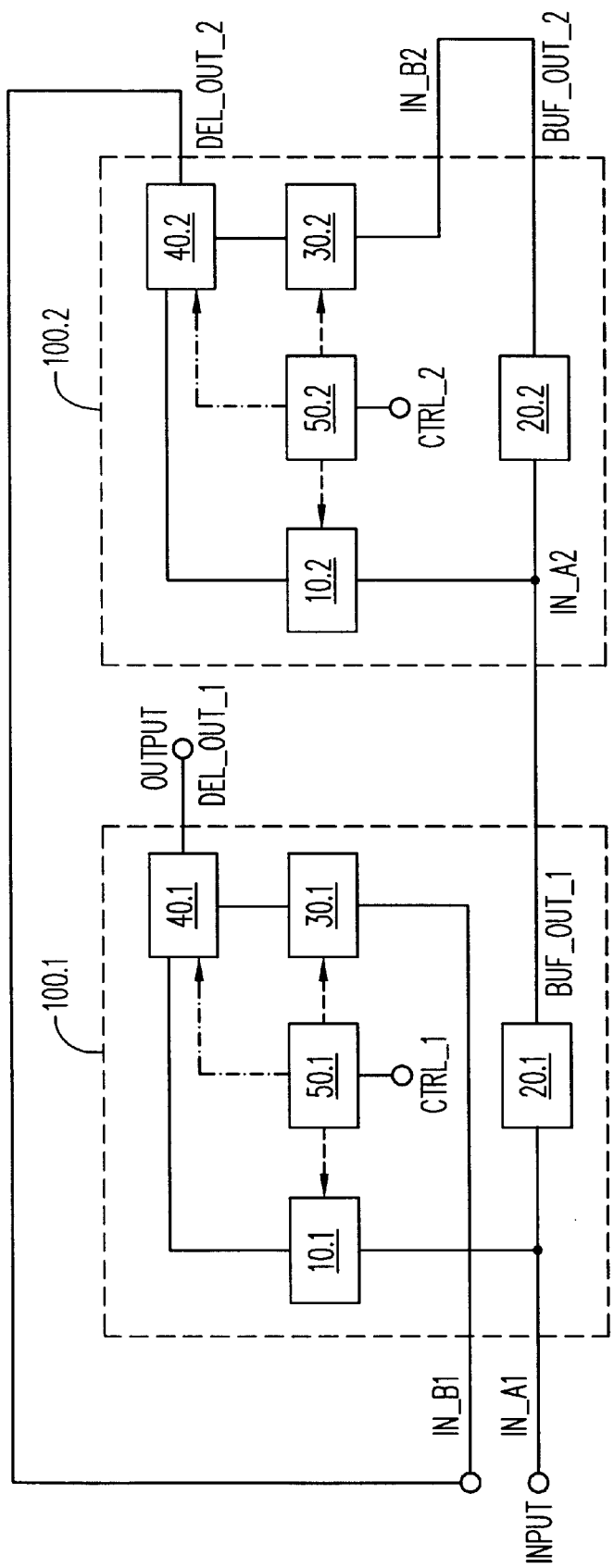
FIG. 2d shows an embodiment for the cascade of FIG. 2c.

The operation of the cascade 110 in FIG. 2c shall be explained in FIG. 2d, wherein the embodiment of FIG. 2b is used for the delay cells 100.1 and 100.2, and in two examples wherein in the first example the delay time $t_{del\_110}$ of the cascade 110 shall be $t_{del\_110} \leq t_{delmax\_1}$, and in the second example $t_{del\_110}$ shall be $t_{delmax\_1} < t_{del\_110} \leq t_{delmax\_1} + t_{delmax\_2}$.

In the first example, for providing a delay time $t_{del\_110}$ of the cascade 110 smaller or equal to the maximum delay time $t_{delmax\_1}$ of the first delay cell 100.1, the input signal INPUT applied at the first input IN_A1 of the first delay cell 100.1 is delayed by a delay stage 20.1 for the fixed delay time $t_{delmax\_1}$ of the first delay cell 100.1, and output at BUF_OUT_1 to the input IN_A2 of the second delay cell 100.2. The control signal CTRL_2 is set to provide a minimum delay time $t_{delmin\_2}$, so that the signal at the first input IN_A2 is directly coupled through a first signal processing unit 10.2 and a third signal processing unit 40.2 of the second delay cell 100.2 to the output DEL_OUT_2, and coupled back to the second input IN_B1 of the first delay cell 100.1. The input signal INPUT, also applied at a first processing unit 10.1 of the first delay cell 100.1, is processed therein and coupled to a third processing unit 40.1, which further receives a signal processed by a second processing unit 30.1 from the delayed and coupled back signal at the input IN_B1. Since the signal at the second input IN_B1 is delayed by the maximum delay time $t_{delmax\_1}$, with respect to the input signal INPUT, the delay time $t_{del\_110}$ can be set by means of the control signal CTRL_1 of the first delay cell 100.1 to any value smaller than the maximum delay time $t_{delmax\_1}$ of the first delay cell 100.1.

The minimum delay time—as the base delay—of the cascade 110 can be set to the minimum delay time $t_{delmin\_1}$ of the first delay cell 100.1, which is only determined by the propagation delay of the first 10 and third 40 processing units.

In the second example, the delay time $t_{del\_110}$ of the cascade 110 can be set between the maximum delay time $t_{delmax\_1}$ of the first delay cell 100.1 and the sum $(t_{delmax\_1} + t_{delmax\_2})$ of the delay times of the first 100.1 and second 100.2 delay cells. According to the above said, the input signal INPUT is coupled to the first processing unit 10.1 and also delayed by the delay stage 20.1 for the fixed delay time $t_{delfix\_1}$ and output as BUF_OUT_1 to the input IN_A2 of the second delay cell 100.2.

Since the second input IN_B2 and the second output BUF_OUT_2 are coupled together, the second delay cell 100.2 behaves according to the delay cell 5 in FIG. 1b. The signal at the first input IN_A2 will be delayed within the second delay cell 100.2 by the delay time $t_{del\_2}$ according to the setting of the control signal CTRL_2 and output at the output DEL_OUT_2. At that moment, the signal at DEL_OUT_2 is delayed with respect to the input signal INPUT by the maximum delay time $t_{delmax\_1}$ of the first delay cell 100.1 and the delay time $t_{del\_2}$ of the second delay cell 100.2, and coupled back to the second input IN_B1 of the first delay cell 100.1.

The first delay cell 100.1 thus receives the input signal INPUT at input IN_A1 and a signal at IN_B1 which is delayed with respect to INPUT by $(t_{delmax\_1} + t_{del\_2})$. The control signal CTRL_1 is set in a way that the signal at IN_B1 is directly coupled to the DEL_OUT_1 and thus provides the output signal OUTPUT. It is to be understood that a mixing of the signal at IN_B1 with a delay greater than the maximum delay time $t_{delmax\_1}$ of the first delay cell 100.1 with the input signal INPUT will also lead to 'horizontal steps' in the output signal OUTPUT during a transition, and thus to jitter, which normally is to be avoided.

In case that $t_{del\_2}$ is set to be the maximum delay time $t_{delmax\_2}$, the maximum delay time of the cascade 110 of $(t_{delmax\_1}+t_{delmax\_2})$ can be chosen. However, the full range of possible delay values up to $(t_{delmax\_1}+t_{delmax\_2})$ can be selected by means of the control signals CTRL_1 and CTRL_2.

Figure 2E:
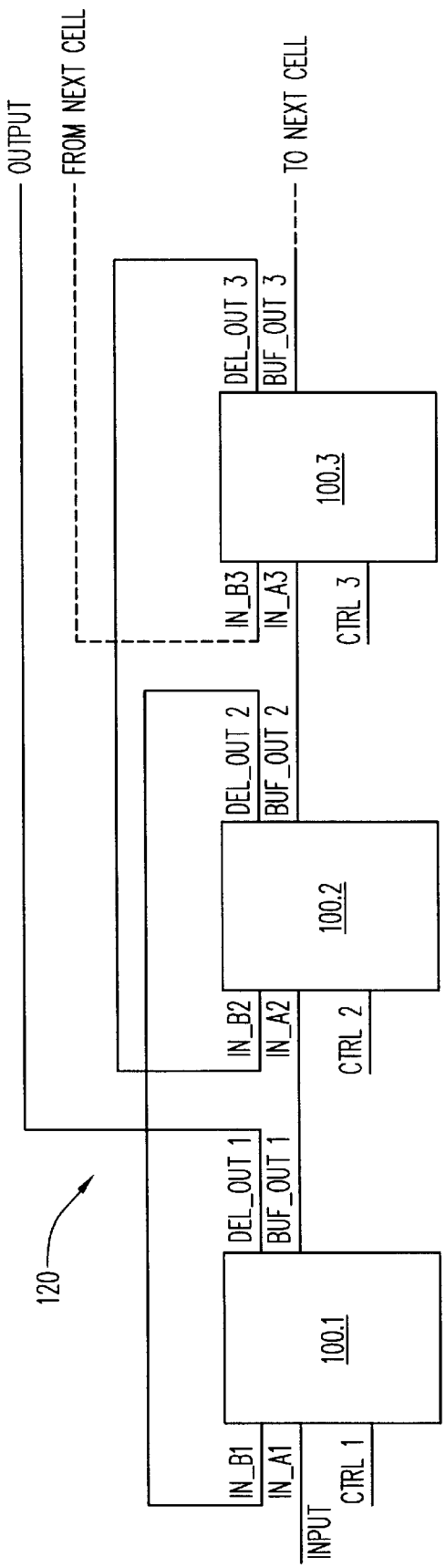
FIG. 2e shows a cascade 120 of a plurality of delay cells 100 according to FIG. 2a, FIG. 3a shows an example of an implementation of the delay cell of FIG. 2b in a differential logic.

FIG. 2e shows a cascade 120 of a plurality of delay cells 100 according to FIG. 2a. The principle of the cascading of the delay cells 100.1 can be explained by the following. The first delay cell 100.1 receives the input signal INPUT at its input IN_A1 and provides the output signal OUTPUT at its output DEL_OUT_1. Each delay cell 100.i provides from the signal received at its input IN_Ai a first output DEL_OUT_i, as the signal at input IN_Ai delayed by a delay time $t_{del\_i}$ according to a setting of the control signal CTRL_i, and a second output BUF_OUT_i, as the signal at input IN_Ai delayed by the fixed delay time $t_{delfix\_i}$ of the delay cell 100.i. The first output DEL_OUT_i of each delay cell 100.i, except of the first delay cell 100.1, is coupled to the input IN_B(i−1) of its preceding delay cell 100.(i−1). Except in the last delay cell 100.n of the cascade 110, the second output BUF_OUT_i is coupled to the input IN_A (i+1) of its successive delay cell 100.(i+1). Only the last delay cell 100.n couples its output BUF_OUT_n directly to its input IN_Bn.

From the above said, it is apparent that the cascade 120 is not limited to a certain number of delay cells 100.i, and that the delay time $t_{del\_120}$ of the cascade can be set up at maximum to the sum of the maximum delay times $t_{delmax\_i}$ of all of the delay cells 100.i. However, the minimum delay time—as the base delay—of the cascade 120 (and also 110) is the same as the base delay of the single delay cell 100, only determined by the propagation delay of the first 10 and third 40 processing units.

It is clear that the maximum delay times $t_{delmax\_i}$ of all of the individual delay cells 100.i, can be different. However, for the sake of simplicity and for reducing production costs, the maximum delay times $t_{delmax\_i}$ of the individual delay cells 100.i, are preferably all the same within a certain tolerance.

In some applications, it might be advantageous to limit the number of signals in the control signals CTRL_i, particularly when analog signals are applied. In that case, the control signals CTRL_i can comprise an individual signal VARFIX_i for setting the delay cell 100.i into a fixed or a variable mode, another individual signal MINMAX_i for setting the delay time of the delay cell 100.i either to the minimum delay time $t_{delmin\_i}$ or to the maximum delay time $t_{delmax\_i}$, and a common signal COM for setting the delay time of the cascade. The individual signal VARFIX_i applied to a respective delay cell 100.i will set this delay cell 100.i in either a fixed mode, wherein the delay time $t_{del\_i}$ is set either to the minimum delay time $t_{delmin\_i}$ or to the maximum delay time $t_{delmax\_i}$ of that delay cell, or into a variable mode, wherein the delay time can be set by means of the common signal COM to a value $t_{del\_i}$ between the minimum and the maximum delay time of that delay cell. In the fixed mode, the delay cell 100.i will be set by means of the individual signal MINMAX_i to delay the signal at output DEL_OUT_i, with respect to the input IN_Ai, by either the minimum delay time $t_{delmin\_i}$ or the maximum delay time $t_{delmax\_i}$. The common signal COM will only have an influence if the delay cell 100.i is in the variable mode.

Figure 3A:
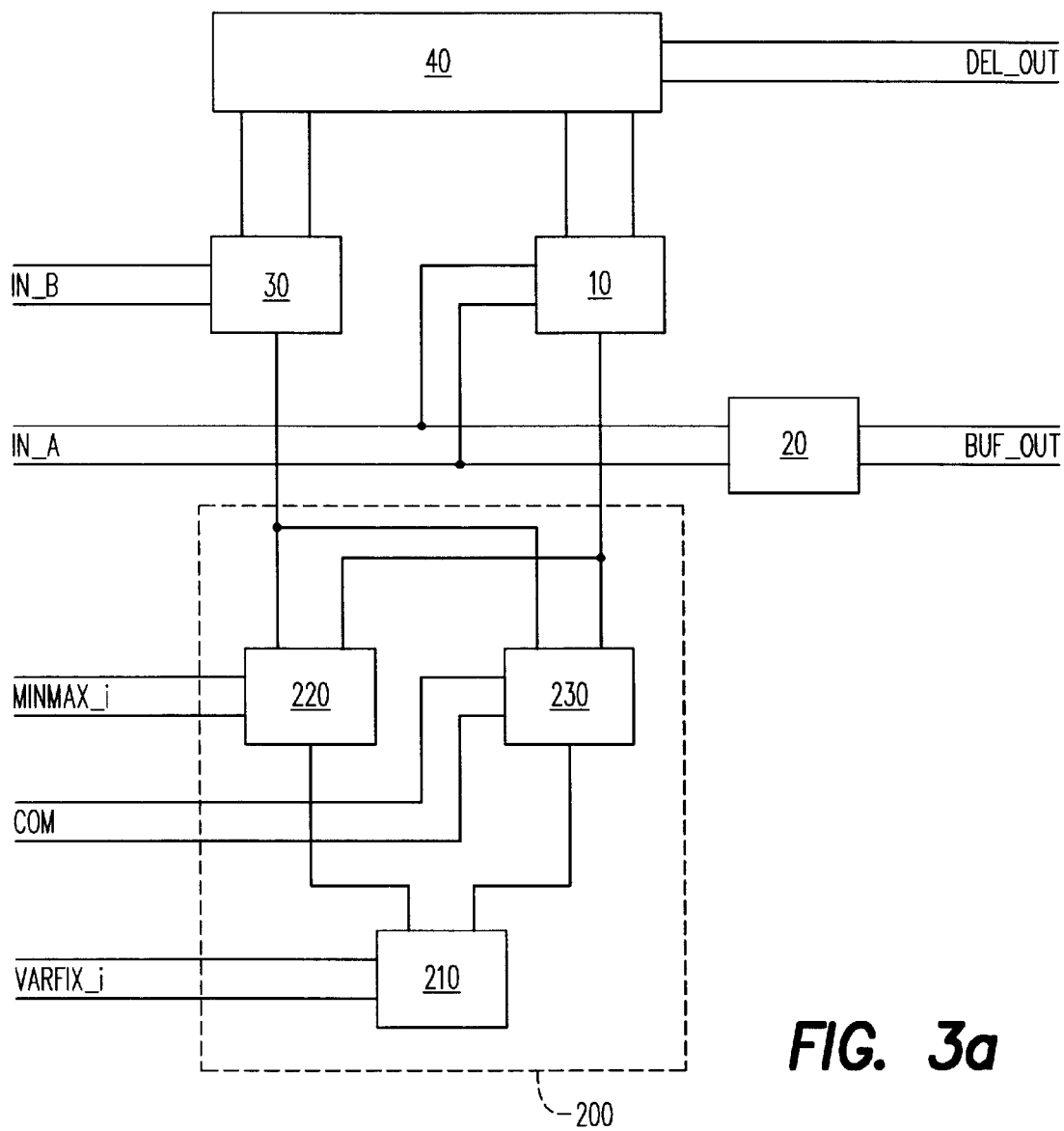

FIG. 3a shows an example of an implementation of the delay cell of FIG. 2b in a differential logic, however wherein the control signal CTRL comprises the individual signals VARFIX_i and MINMAX_i and the common signal COM.

The delay cell in FIG. 3a is basically built up accordingly to the delay cell in FIG. 2b, whereby the first 10 and second 30 signal processing units and the delay stage 20 receive differential input signals. However, the control unit 50 has been replaced by a control unit 200 receiving the control signals VARFIX_i, MINMAX_i, and COM. The control unit 200 comprises a first control circuit 210 which receives the control signal VARFIX_i, a second control circuit 220 which receives the control signal MINMAX_i, and a third control circuit 230 which receives the control signal COM.

When the control circuit 210 is set via the control signal VARFIX_i into the fixed mode, it will activate the second control circuit 220 and deactivate the third control circuit 230. When the second control circuit 220 is set via the control signal MINMAX_i to a minimum delay time, it will activate the first signal processing unit 10 and deactivate the third signal processing unit 30, so that the signal at input IN_A will be (directly) coupled to DEL_OUT. When the second control circuit 220 is set via the control signal MINMAX_I to a maximum delay time, it will deactivate the first signal processing unit 10 and activate the third signal processing unit 30. so that the signal at input IN_B will be (directly) output to DEL_OUT.

When the control circuit 210 is set via the control signal VARFIX_i into the variable mode, it will deactivate the second control circuit 220 and activate the third control circuit 230 which will control the first 10 and the second 30 signal processing units in accordance to the controlling of the control unit 50 in FIG. 2b.

Figure 3C:
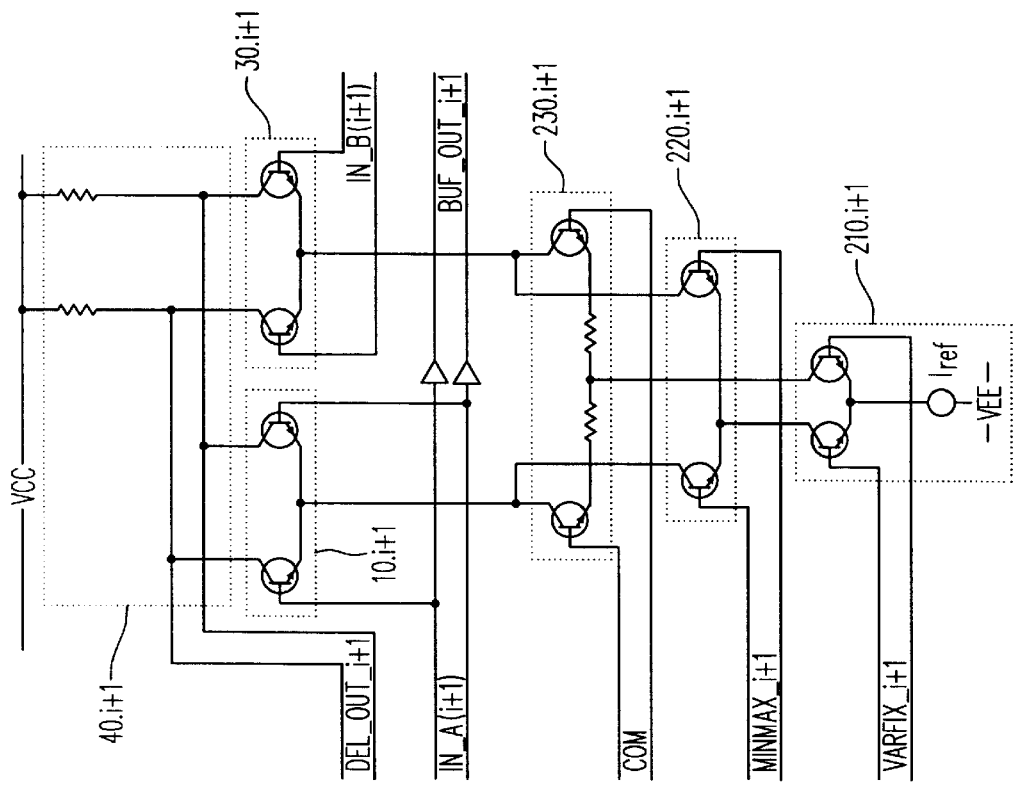
Figure 3B:
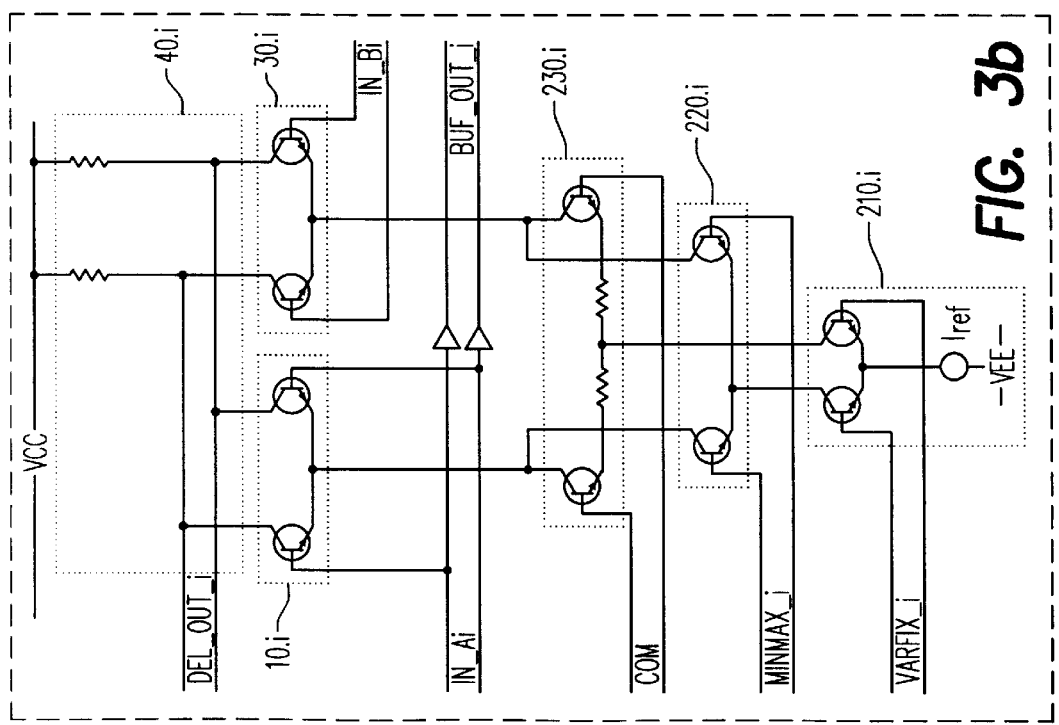
FIG. 3b shows a more detailed implementation of the delay cell of FIG. 3a, FIG. 3c shows—in combination with FIG. 3b—a cascading of two delay cells of FIG. 3b.

FIG. 3b (in a dotted box) shows a more detailed implementation of the delay cell of FIG. 3a. The signal processing units 10.i and 30.i and the control units 210.i, 220.i, and 230.i are embodied as current switches, and the third signal processing unit 40.i is embodied as a sum up stage.

FIG. 3c shows—in combination with FIG. 3b—a cascading of two delay cells of FIG. 3b. In that case, IN_Bi will be connected with DEL_OUT_i+1, BUF_OUT_i will be connected with IN_A(i+1). It is to be understood that the number of delay cells to be lined up in accordance with FIG. 3c is not limited to two. It is clear that a plurality of delay cells—arranged as the right delay cell in FIG. 3c and connected with its respective left delay cell—can be grouped to the right side in FIG. 3c. In any case, the input IN_Bn and the output BUF_OUT_n of the last delay cell n (on the very right side) will be coupled together.

Figure 3D:
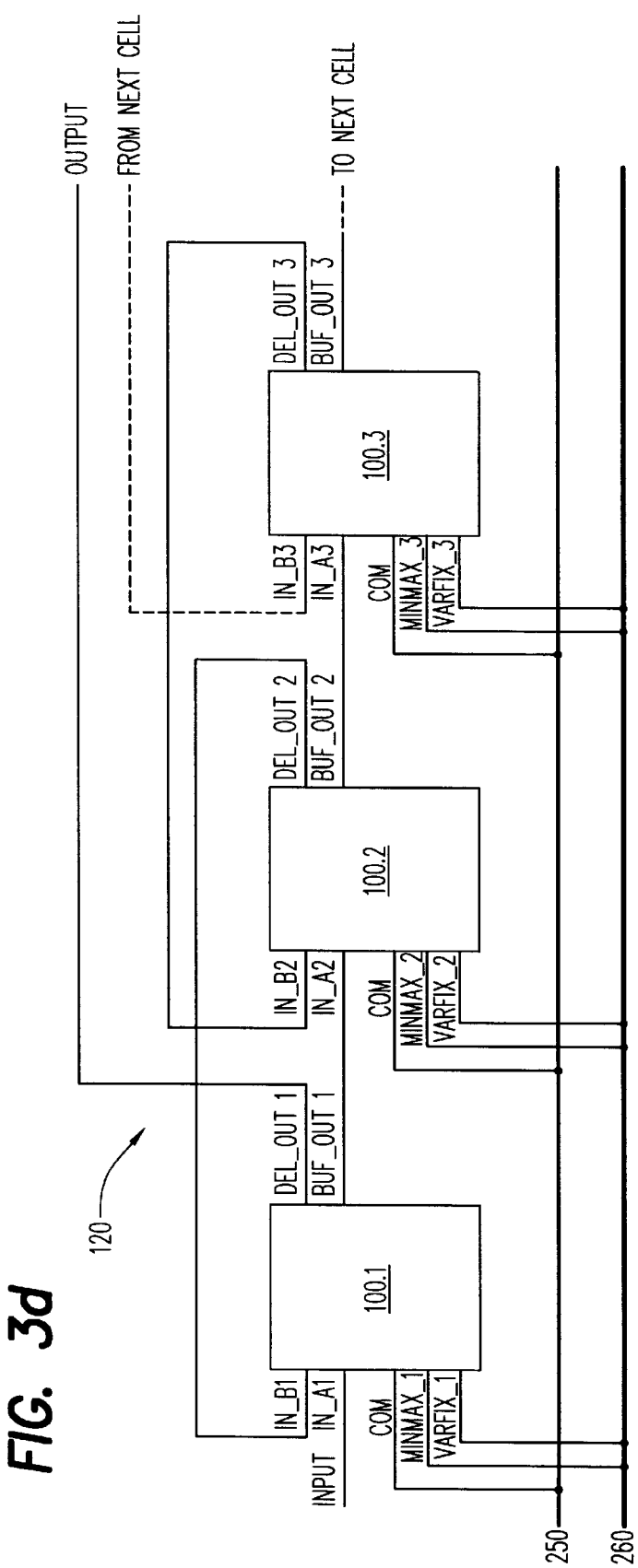

FIG. 3d shows in a schematic view an arrangement of a plurality of delay cells of FIG. 3a, which are grouped in accordance with the arrangement as depicted in FIG. 2e. However in FIG. 3d, the control signal COM is supplied by a (single) control line 250 to each one of the plurality of delay cells 100.i, e.g., as an analog signal. In contrast thereto, the individual control signals MINMAX_i and VARFIX_i are individually supplied to each delay cell 100.i. As depicted in FIG. 3d, the individual control signals MINMAX_i and VARFIX_i might be supplied by a control bus 260, e.g., as digital signals.

In a preferred embodiment, the delay time of only one specific delay cell 100.i is set by means of the control signal VARFIX_i into the variable mode and regulated by means of the control signal COM. All other delay cells are driven in the fixed mode, whereby the delay cell 100.i+1 is set to a minimum delay time and all delay cells 100.x with x<i (or in other words, the delay cells preceding the delay cell 100.i) are set to a maximum delay time. The delay cells 100.y with y>i+1 are 'short cut' by the delay cell 100.i+1, so that their respective state will not influence the delay time of the cascade 120. This scheme makes sure that 'horizontal steps' in the output signal OUTPUT during a transition are avoided and that only one control signal COM is required.

What is claimed is:

1. A variable digital delay cell comprising:

a first input for receiving a first input signal to be delayed, a first output for providing a first output signal which is delayed with respect to the first input signal by a delay time of the delay cell, and a control signal for controlling the delay time of the delay cell, the delay cell further comprising:

a second input for receiving a second input signal which is delayed with respect to the first input signal, and a second output for providing a second output signal which is delayed with respect to the first input signal by a fixed delay time.

2. A variable digital delay cell comprising:

a first input for receiving a first input signal to be delayed, a first output for providing a first output signal which is delayed with respect to the first input signal by a delay time of the delay cell, and a control signal for controlling the delay time of the delay cell, a second input for receiving a second input signal which is delayed with respect to the first input signal, a second output for providing a second output signal which is delayed with respect to the first input signal by a fixed delay time, a first signal processing unit coupled with an input thereof to the first input for receiving and processing the first input signal, a delay stage for providing the fixed delay time, an input of the delay stage being coupled to the first input for receiving and delaying the first input signal by the fixed delay time, and an output of the delay stage being coupled to the second output for providing the first input signal delayed by the fixed delay time as the second output signal, a second signal processing unit coupled with an input thereof to the second input for receiving and processing the second input signal, a third signal processing unit for receiving output signals from the first and second signal processing units and processing therefrom the first output signal for the first output, and a control unit coupled to the first and second signal processing units and/or the third signal processing unit, for controlling the delay time of the delay cell in accordance with the applied control signal.

3. The delay cell according to claim 2, wherein:

the first signal processing unit comprises a current switch, the second signal processing unit comprises a current switch, the third signal processing unit comprises a sum up stage, and the control unit comprises a current switch.

4. The delay cell according to claim 2, wherein the control signal comprises:

a first control signal for setting the delay cell into a fixed or a variable mode, a second control signal for setting the delay time of the delay cell to a minimum delay time or to a maximum delay time, a third control signal for setting the delay time of the delay cell to a value between the minimum and the maximum delay time, whereby in the fixed mode, the delay time can be set by means of the second control signal to the minimum delay time or the maximum delay time, and in the variable mode, the delay time can be set by means of the third signal to a value between the minimum and the maximum delay time of the delay cell.

5. A delay cell according to claim 4, wherein:

there are a plurality of cascaded delay cells; and wherein a first delay cell receives the first input signal at the first input thereof and provides the first output signal at the first output thereof, the second output of a last delay cell is coupled to the second input thereof, the first input of each delay cell, except of the first delay cell, is coupled to the second output of the preceding delay cell, and the first output of each delay cell, except of the first delay cell is coupled to the second input of the preceding delay cell, whereby:

the delay time of only one specific delay cell is set by means of its respective first control signal into the variable mode and regulated by means of the third control signal, each other delay cell is set by means of its respective first control signal into the fixed mode, the delay cell successive to the specific delay cell is set by means of its respective second control signal to a minimum delay time, and each delay cell preceding to the specific delay cell is set by means of its respective second control signal to a maximum delay time.

6. The delay cell according to claim 4, wherein the control unit comprises:

a first control circuit for receiving the first control signal, a second control circuit for receiving the second control signal, and a third control circuit for receiving the third control signal, whereby:

when the first control circuit is set via the first control signal into the fixed mode, it will activate the second control circuit and deactivate the third control circuit, when the second control circuit is set via the second control signal to a minimum delay time, it will activate the first signal processing unit and deactivate the third signal processing unit, so that the first input signal at the first input will be coupled to the first output, when the second control circuit is set via the second control signal to a maximum delay time, it will deactivate the first signal processing unit and activate the third signal processing unit, so that the second input signal at the second input will be coupled to the first output, and when the first control circuit is set via the first control signal into the variable mode, it will deactivate the second control circuit and activate the third control circuit for controlling the first and the second signal processing units.

7. The delay cell according to claim 6, wherein:

the first control circuit comprises a current switch, the second control circuit comprises a current switch, and the third control circuit comprises a current switch.

8. A variable digital delay line comprising:

a plurality of variable digital delay cells, each delay cell comprising:
- a first input for receiving a first input signal to be delayed,
- a first output for providing a first output signal which is delayed with respect to the first input signal by a delay time of the delay cell, and
- a control signal for controlling the delay time of the delay cell,
- wherein each delay cell further comprises:
  - a second input for receiving a second input signal which is delayed with respect to the first input signal, and
  - a second output for providing a second output signal which is delayed with respect to the first input signal by a fixed delay time;

wherein said plurality of delay cells are cascaded and wherein a first delay cell receives the first input signal at the first input thereof and provides the first output signal at the first output thereof, the second output of a last delay cell is coupled to the second input thereof, the first input of each delay cell, except of the first delay cell, is coupled to the second output of the preceding delay cell, and the first output of each delay cell, except of the first delay cell, is coupled to the second input of the preceding delay cell.

9. The variable digital delay line according to claim 8, wherein the first input signal and the first output signal are differential signals.

10. The delay cell according to claim 8, wherein said plurality of cascaded delay cells further comprises:

an inverter circuit, whereby the first output signal of the cascade is coupled back via the inverter circuit to the first input signal of the cascade to form an oscillator circuit.

11. A variable digital delay cell comprising:
- a first input for receiving a first input signal to be delayed,
- a first output for providing a first output signal which is delayed with respect to the first input signal by a delay time of the delay cell, and
- a control signal for controlling the delay time of the delay cell, the delay cell further comprising:
- a second input for receiving a second input signal which is delayed with respect to the first input signal, and
- a second output for providing a second output signal which is delayed with respect to the first input signal by a fixed delay time;

wherein the first input signal (INPUT) and the first output signal (OUTPUT) are differential signals.

12. A variable digital delay line comprised of at least one variable digital delay cell, said cell comprising:
- a first input for receiving a first input signal to be delayed,
- a first output for providing a first output signal which is delayed with respect to the first input signal by a delay time of the delay cell, and
- a control signal for controlling the delay time of the delay cell, the delay cell further comprising:
- a second input for receiving a second input signal which is delayed with respect to the first input signal, and
- a second output for providing a second output signal which is delayed with respect to the first input signal by a fixed delay time; and wherein said variable digital delay line further comprises an inverter circuit, whereby the first output signal of the delay line is coupled back via the inverter circuit to the first input signal of the delay line to form an oscillator circuit.

* * * * *